United States Patent [19]

Messerschmidt et al.

[11] 3,891,483

[45] June 24, 1975

[54] METHOD FOR ETCHING SEMICONDUCTOR SURFACES

[75] Inventors: Jürgen Messerschmidt, Letmathe; Rigobert Schimmer, Belecke, both of Germany

[73] Assignee: Licentia-Patent-Verwaltungs G.m.b.H., Frankfurt am Main, Germany

[22] Filed: May 30, 1974

[21] Appl. No.: 474,865

[30] Foreign Application Priority Data

June 1, 1973 Germany ............ 2327878

[52] U.S. Cl. ............ 156/3; 29/589; 156/7; 156/17; 252/79.3

[51] Int. Cl. ............ H01l 7/50

[58] Field of Search ............ 156/3, 7, 8, 11, 13, 16, 156/17; 117/217; 29/580, 589, 590, 591; 148/1.5; 204/14, 23, 27; 252/79.3, 79.4

[56] References Cited

UNITED STATES PATENTS

| | | | |
|---|---|---|---|
| 3,082,136 | 3/1963 | Finn | 156/17 |
| 3,490,140 | 1/1970 | Knight et al. | 29/576 |
| 3,537,919 | 11/1970 | Bittmann | 156/17 X |
| 3,656,228 | 4/1972 | Glass | 29/578 |

*Primary Examiner*—William A. Powell
*Attorney, Agent, or Firm*—Spencer & Kaye

[57] ABSTRACT

A method for etching semiconductor surfaces of a semiconductor body includes the step of soldering coated electrodes to the semiconductor body to provide exposed semiconductor surfaces and protected semiconductor surfaces covered by the coated electrodes. Each coated electrode comprises an electrode to which a nickel layer and then a silver layer has been applied. The semiconductor body is contacted with an etchant to etch the exposed semiconductor surfaces. The etched body is rinsed with deionized water and then treated with an ammoniacal hydrogen peroxide solution.

22 Claims, 1 Drawing Figure

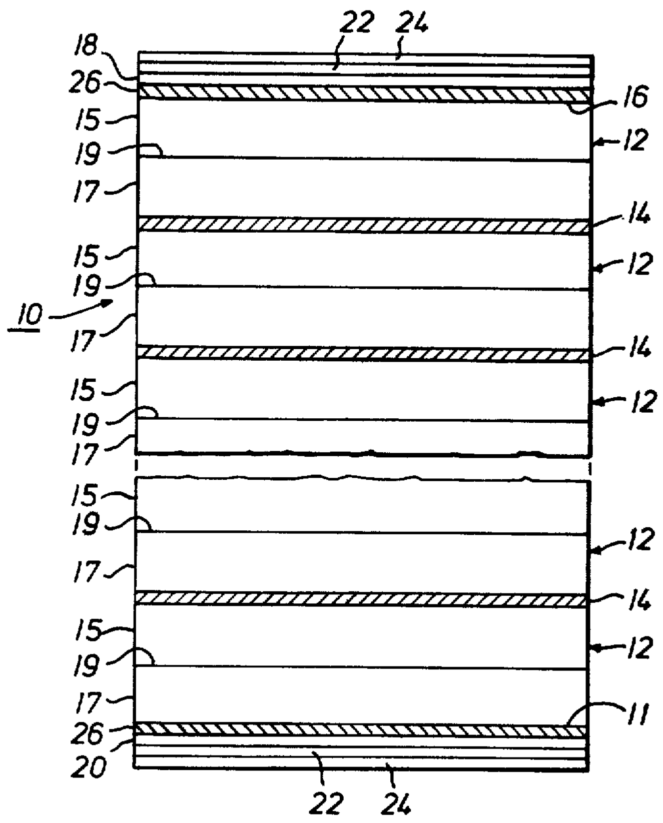
22
24
18
26
16
15
12
19
17
14
15
19
10
12
17
14
15
12
19
17
15
19
12
17
14
15
12
19
17
11
26
20
22
24

METHOD FOR ETCHING SEMICONDUCTOR SURFACES

BACKGROUND OF THE INVENTION

The present invention relates to a method for etching semiconductor surfaces.

It is known that duuring fabrication of semiconductor devices, particularly semiconductor devices which are designed for handling high voltages, the surfaces of the devices are subjected to an etching treatment. This etching treatment serves the purpose, inter alia, to remove undesirable impurities which are absorbed by the surfaces and to thus stabilize the electrical properties of the components. It has been found that the absorption of impurities, particularly in regions where pn-junctions extend to the surface, unfavorably influences the characteristic values of the components and worsens, for example, the reverse currents.

In order to obtain a high yield of components with low reverse currents at high blocking voltages, an etching treatment of the semiconductor surfaces becomes a necessity, the etching means being acids or acid mixtures such as for example a nitric acid/hydrofluoric acid/acetic acid mixture, or bases such as a hot potassium hydroxide solution. However, in spite of this treatment, the resulting components do not always have low and stable reverse currents, probably because metal ions formed during the etching reaction are again absorbed by the semiconductor surfaces.

SUMMARY OF THE INVENTION

It is a primary object of the present invention to provide a method for etching semiconductor surfaces which provides a higher yield of such components which have particularly low and stable reverse currents at high blocking voltages.

This, as well as other objects which will be apparent from the description which follows, are achieved by a method for etching semiconductor surfaces of a semiconductor which, as embodied and broadly described, comprises soldering coated electrodes to the semiconductor body to provide exposed semiconductor surfaces and protected semiconductor surfaces covered by the coated electrodes; contacting the semiconductor with an etchant to etch the exposed semiconductor surfaces, rinsing the etched body with deionized water; and then treating the rinsed body with an ammoniacal hydrogen peroxide solution. The coated electrodes that are soldered to the semiconductor body each comprise an electrode to which a nickel layer and then a silver layer has been applied. It is preferred that the etchant be a mixture of nitric acid, hydrofluoric acid and acetic acid.

It is to be understood that both the foregoing general description and the following detailed descriptions are exemplary and explanatory, but are restrictive of the invention.

DESCRIPTION OF THE DRAWING

The accompanying drawing illustrates an example of a preferred embodiment of the invention and together with the description serves to explain the principles of the invention.

The drawing is a fragmentary cross-sectional view of a semiconductor body before etching and to which coated electrodes have been applied in accordance with the teaching of the present invention.

DETAILED DESCRIPTION OF THE INVENTION

In accordance with the present invention, the electrodes that are applied to the semiconductor body are coated first with a nickel layer and then with a silver layer. The nickel layer can be electrolytically applied to the electrodes in accordance with well known electroplating techniques. Alternatively, the nickel layer can be applied by electroless plating of nickel onto the electrode followed by a nickel electroplating to reinforce the electrolessly applied layer.

After the nickel layer has been applied, a silver layer is coated onto the nickel layer of the electrode. The silver layer preferably is electrolytically deposited on the nickel layer in accordance with well known electroplating techniques. The nickel and silver layers preferably are each applied to have a layer thickness of $4 \pm 1\mu$.

The nickel and silver layers can completely cover the electrodes, or the layers can be applied only to those surface regions of the electrodes which after application of the electrodes to the semiconductor body constitute the free surface of the electrode and are to be protected against attack by the etching medium. As will be understood by those skilled in the art, the "free surface" of the electrode refers to the surface that faces away from and is not in contact with the semiconductor body and exposed for connection to an external circuit. The electrodes that are used in the practice of the present invention preferably are made of copper, nickel or silver.

After the electrodes have been provided with the nickel and silver layers, they are attached to the semiconductor body. The coated electrodes can be attached to the semiconductor body by soldering with the aid of conventional soft or hard solders, or they are soldered by alloying via intermediate layers of tungsten, molybdenum, aluminum or aluminum alloys.

The semiconductor body to which the electrodes are applied is preferably made of silicon and preferably comprises a column of semiconductor wafers arranged one on top of the other. Each wafer can be conductively connected to its immediately adjacent wafer or wafers by a suitable adhesive or by soldering with an alloy layer such as an aluminum or aluminum containing layer, or by soldering by conventional hard or soft solders, Au-Sn or Pb-In-Ag or Pb-Sn, for example.

Each wafer in the column preferably has a small thickness of, for example, $220\mu$ and has square top and bottom surfaces. A plurality of such columns can be formed from a packet of stacked wafers by cutting, for example, by sawing or by ultrasonic drilling, along lines intersecting in grid-like configuration.

After the individual columns are formed, the coated electrodes are attached to each column. Preferably, two electrodes are attached to opposing surfaces of a column, for example one electrode to the top surface of the top wafer in the column and the other electrode to the bottom surface of the bottom wafer. The electrodes protect the top and bottom surfaces of the semiconductor body, but leave the side surfaces exposed.

After the electrodes are attached to the semiconductor body, the exposed surfaces of the semiconductor body are etched by immersing the semiconductor body in an etchant. Exemplary of a suitable etchant is an acid mixture having a composition of 2 parts by volume fuming nitric acid, 1 part by volume 40% hydrofluoric acid solution and 1 part by volume concentrated acetic acid. Preferably, the etching temperature should be about 18°–20°C, and the etching time should lie between about 15 and 300 seconds depending on the type of component involved and the pretreatment of the surface. Another example of a suitable etchant is an acid mixture having a composition of fuming nitric acid, 40% hydrofluoric acid solution, concentrated acetic acid and phosphoric acid.

As soon as the etching is completed, the acid is quickly diluted with a large quantity of completely desalted, deionized water and the semiconductor body is then removed from the diluted etching solution.

After removal from the etching solution, the semiconductor body is treated with an ammoniacal hydrogen peroxide solution. This treatment is advantageously begun at a temperature of about 55° to 60°C and continued, without further heating, for a period of about 4 to 5 minutes. Preferably, the ammoniacal hydrogen peroxide solution is a mixture consisting of 1 part by volume concentrated ammonium hydroxide solution, 1 part by volume 30% hydrogen perioxide solution and 4 parts by volume completely deionized desalted water. The ammoniacal hydrogen peroxide solution is preferably used as soon as it is prepared to prevent the concentration of ammonium ions in the solution from becoming too low and not bringing about the desired result.

The process according to the present invention, which has proven particularly satisfactory in the production of high voltage diodes including a silicon semiconductor body, provides sufficient protection of the electrodes (e.g., copper electrodes) during etching since the silver layer which covers the electrodes is substantially etch resistant and thus remains substantially intact. During the subsequent treatment with the ammoniacal hydrogen peroxide solution, the silver layer is completely dissolved and the silver is bound as a complex so that it is removed and is not absorbed on the exposed semiconductor surfaces. The nickel layer then protects the copper electrodes against attack during the treatment with the ammoniacal hydrogen peroxide solution. Thus, under the above-mentioned operating conditions the silver layer will completely dissolve in a short period of time, i.e., in about one minute. The nickel layer which has been applied electrolytically or electrolessly and has been electrolytically reinforced, can withstand this ammoniacal hydrogen peroxide solution treatment.

Absorption of the metal ions of copper, silver or nickel which may have nevertheless been present in the solution, or of other impurities does not occur at the semiconductor surface because the subsequent treatment with ammoniacal hydrogen peroxide solution complexly binds these substances and thus removes them without exerting any adverse influence on the electrical properties of the semiconductors. Thus, semiconductor surfaces are obtained which exhibit high stability in components with very low reverse currents.

Semiconductor components produced according to the method of the present invention exhibit a substantial improvement in blocking current. Thus, the averages of test results indicated that at voltages of about 15,000V directly after etching without subsequent treatment with ammoniacal hydrogen peroxide solution, the blocking currents were at a level of 10$\mu$A. After the subsequent treatment with ammoniacal hydrogen peroxide solution according to the present invention, the blocking currents dropped to 0.1$\mu$A and were thus lower by about two powers of ten.

The method according to the present invention will be described once more in the following example for an embodiment of a high voltage diode with a silicon semiconductor body. This example is given by way of illustration to further explain the principles of the invention. This example is merely illustrative and is not to be understood as limiting the scope and underlying principles of the invention in any way.

A packet containing a plurality of silicon wafers, approximately 18 in number, is divided by sawing or ultrasonic drilling into small columns each having square top and bottom surfaces. One such column 10 is shown in the drawing. Column 10 contains a plurality of silicon wafers 12, each having a thickness of about 220$\mu$, and conductively connected together by layers 14 formed by an adhesive or by soldering by alloying, for example by means of aluminum or aluminum containing layers, or by soldering with hard or soft solders. Each wafer 12 preferably has a p-zone 15 and an n-zone 17 of opposing conductivity and a p-n transition junction 19 which extends to the surface of the wafer. The wafers are arranged so that the p-zone of one wafer is adjacent the n-zone of its immediately adjacent wafer. The top surface 16 of top wafer 12 is square, as is the bottom surface 11 of the bottom wafer 12.

As seen in the drawing, copper electrodes 18 and 20, each having a nickel layer 22 and a silver layer 24 on top of the nickel layer, are soldered to top surface 16 of top wafer 12 and bottom surface of the bottom wafer 12, respectively, to completely cover these surfaces. The nickel and silver layers, each of which have a thickness of 4 $\pm$ 1$\mu$ and have been deposited on the copper electrolytically, face away from the semiconductor surfaces and form a protective cover for the copper electrode and semiconductor surfaces underlying the layers.

The coated electrodes 18 and 20 are applied to the top and bottom surfaces of the column by a layer 26 formed either with the aid of soft or hard solders or by soldering by alloying via intermediate layers of tungsten, molybdenum, aluminum or aluminum alloys.

The soldered columns, such as column 10, are now etched with a mixture of nitric acid, hydrofluoric acid and acetic acid for about 60 seconds. The etching treatment removes the outer surface layers of the exposed semiconductor surfaces. As soon as the etching is completed, the acid is quickly diluted with a large quantity of completely desalted, deionized water and is removed. Following the etching, the columns containing the electrodes are subjected to a further treatment for from 4 to 5 minutes. The ammoniacal hydrogen peroxide mixture required for this purpose is produced by mixing 4 parts by volume of completely deionized desalted water heated to about 70°C with 1 part by volume of concentrated ammonium hydroxide solution. One part by volume of a 30% hydrogen peroxide solution is stirred into this solution at about 65°C whereupon the temperature drops to about 60°C. The mixture produced in this manner is immediately, i.e., within about 30 seconds, used to subsequently treat the freshly etched semiconductor surfaces. Storage or reheating of the solution must not take place since the concentration of the ammonium ions might then become too low and their effect would be adversely influenced.

During the treatment with the ammoniacal hydrogen peroxide solution the impurities still present in spite of the etching or as a result of the etching are removed from the exposed semiconductor surfaces of the semiconductor body. If aluminum layerrs are used as alloying layers to join the silicon wafers, these layers are simultaneously dissolved and removed in the same process step in the ammoniacal hydrogen peroxide mixture. These aluminum layers are not attacked by the etching medium and thus protrude over the edges of the wafers after the etching process and the removal of the outer silicon layers.

It will be understood that the above description of the present invention is susceptible to various modifications, changes and adaptations, and the same are intended to be comprehended within the meaning and range of equivalents of the appended claims.

We claim:

1. A method for etching semiconductor surfaces of a semiconductor body comprising:

a. soldering coated electrodes to the semiconductor body, said coated electrodes each comprising an electrode to which a nickel layer and then a layer of silver has been applied, to provide exposed semiconductor surfaces and protected semi-conductor surfaces covered by said coated electrodes,
b. contacting the semiconductor body with an etchant to etch the exposed semiconductor surfaces,
c. rinsing the etched semiconductor body surfaces with deionized water, and
d. treating the rinsed body with an ammoniacal hydrogen peroxide solution.

2. The method as defined in claim 1 wherein the semiconductor surfaces are etched with a nitric acid/-hydrofluoric acid/acetic acid mixture.

3. The method as defined in claim 1 wherein the electrodes are completely covered with the nickel layer and silver layer before they are soldered to the semiconductor body.

4. The method as defined in claim 1 wherein before soldering the electrodes have been coated with a nickel layer and then a silver layer on those surface portions which form the free surface of the electrodes after application of the electrodes to the semiconductor body.

5. The method as defined in claim 1 wherein the electrodes are copper electrodes.

6. The method as defined in claim 5 wherein the copper electrodes are soldered on via intermediate layers of aluminum, tungsten or molybdenum to opposing surfaces of the semiconductor body.

7. The method as defined in claim 1 wherein the semiconductor wafer which is being etched is made of silicon.

8. The method as defined in claim 1 wherein the semiconductor body comprises a column of a plurality of silicon wafers.

9. The method as defined in claim 8 wherein the silicon wafers in the column are connected to one another by alloying with aluminum or aluminum containing alloys.

10. The method as defined in claim 8 wherein the electrodes are soldered to the silicon wafers by aluminum or aluminum containing alloys.

11. The method as defined in claim 9 wherein the aluminum layers present between the silicon wafers are not attacked by the etching medium and thus protrude over the edges of the silicon wafers after the etching process and removal of the outer silicon layers, are simultaneously and in the same process step dissolved and removed in the ammoniacal hydrogen peroxide mixture.

12. The method as defined in claim 1 wherein the nickel layer is applied to the electrodes electrolytically.

13. The method as defined in claim 1 wherein the nickel layer is deposited on the electrodes to a thickness of $4 \pm 1\ \mu$.

14. The method as defined in claim 1 wherein the silver layer is electrolytically applied to the nickel layer of the electrodes.

15. The method as defined in claim 1 wherein the silver layer is deposited onto the nickel layer to a thickness of $4 \pm 1\ \mu$.

16. The method as defined in claim 1 wherein the etching is effected with an acid mixture containing 2 parts by volume fuming nitric acid, 1 part by volume of a 40% hydrofluoric acid solution and 1 part by volume of concentrated acetic acid.

17. The method as defined in claim 1 wherein the etching is effected at a temperature of about 18° to 20°C.

18. The method as defined in claim 1 wherein the etching is effected for about 15 to 300 seconds.

19. The method as defined in claim 1 wherein the treatment with the ammoniacal hydrogen peroxide solution treatment is begun at a temperature of about 55° to 60°C.

20. The method as defined in claim 1 wherein the treatment with the ammoniacal hydrogen peroxide solution is effected with a mixture of 1 part by volume concentrated ammonium hydroxide solution, 1 part by volume of a 30% hydrogen peroxide solution and 4 parts by volume of completely deionized water.

21. The method as defined in claim 1 wherein the treatment with the ammoniacal hydrogen peroxide solution is carried out for a period of about 4 to 5 minutes.

22. The method of claim 6 wherein a first electrode is soldered to the top surface of the semiconductor body and a second electrode is soldered to the bottom surface of the semiconductor body.

* * * * *